United States Patent [19]

Takagi

[11] Patent Number: 4,646,125

[45] Date of Patent: Feb. 24, 1987

[54] SEMICONDUCTOR DEVICE INCLUDING DARLINGTON CONNECTIONS

[75] Inventor: Yoshio Takagi, Itami, Japan

[73] Assignee: Mitsubishi Denki Kabushiki Kaisha, Tokyo, Japan

[21] Appl. No.: 517,715

[22] Filed: Jul. 27, 1983

[51] Int. Cl.$^4$ .................... H01L 27/02; H01L 23/48; H01L 27/10; H01L 29/40
[52] U.S. Cl. ...................................... 357/46; 357/86; 357/71; 357/65; 357/68
[58] Field of Search ...................... 357/46, 86, 71, 68, 357/65

[56] References Cited

U.S. PATENT DOCUMENTS 3,596,150  7/1971  Berthold et al. ...................... 357/46
4,312,011  1/1982  Kanbayashi ........................... 357/46

Primary Examiner—Martin H. Edlow
Assistant Examiner—Jerome Jackson, Jr.
Attorney, Agent, or Firm—Lowe Price LeBlanc Becker & Shur

[57] ABSTRACT

A semiconductor device includes a plurality of transistors formed on a common substrate and connected in a Darlington configuration. A conductor is connected between a metallization layer on the base region of a transistor of the last stage in the Darlington connections and a metallization layer on the emitter region on a transistor of the stage preceding the last stage in the Darlington connections.

4 Claims, 9 Drawing Figures

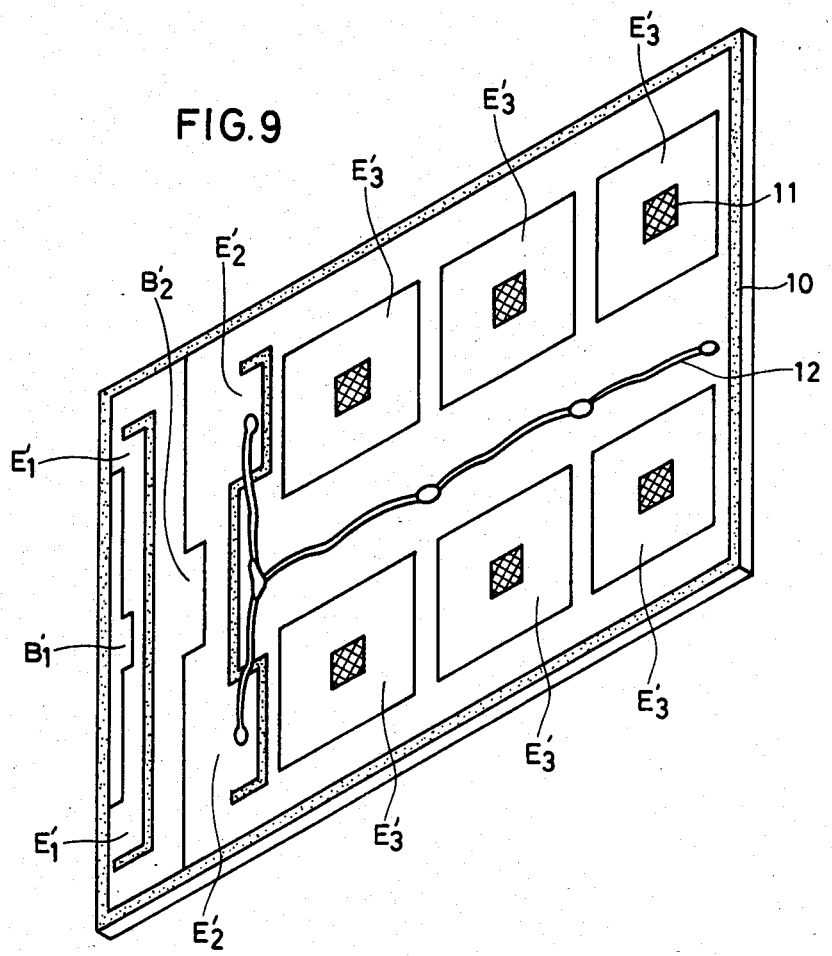

SEMICONDUCTOR DEVICE INCLUDING DARLINGTON CONNECTIONS

BACKGROUND OF THE INVENTION

1. Field of the Invention

The present invention relates to a semiconductor device including Darlington connections, and, more particularly, to an improvement for enhancing performance of the transistors in the Darlington connections included in the semiconductor device.

2. Description of the Prior Art

In general, a current amplification factor $h_{FE}$ is important for performance of a transistor device. In order to increase the current amplification factor, a Darlington connection has been widely used. In this case, there are two manners, one being that a plurality of devices are used for Darlington connection and the other being that the Darlington connection is structured by a single device. Recently, the latter approach has been widely used since it is advantageous for miniaturization.

FIG. 1 is a Darlington circuit structured by two devices. The Darlington connection shown in FIG. 1 includes two transistors $T_{r1}$ and $T_{r2}$ having, respectively, collectors C1 and C2, emitters E1 and E2, and bases B1 and B2. $I_C$ denotes a collector current, $I_E$ denotes an emitter current and $I_B$ denotes a base current. Assuming that the current amplification factors of the first stage transistor $T_{r1}$ and the second stage transistor $T_{r2}$ are $h_{FE1}$ and $h_{FE2}$, respectively, whole current amplification factor $h_{FE}$ equals to $h_{FE1} \cdot h_{FE2}$. Since the factors $h_{FE1}$ and $h_{FE2}$ both are sufficiently larger than 1, the whole current amplification factor $h_{FE}$ becomes considerably larger as compared with that in a single transistor. As a result, a current flowing into the second stage transistor $T_{r2}$ becomes larger than a current flowing into the first stage transistor $T_{r1}$ and hence, if and when both transistors are structured by using the same material, the size, that is, a chip area, of the second stage transistor $T_{r2}$ must be made larger than that of the first stage transistor $T_{r1}$.

FIG. 2 is a Darlington connection structured by using a single device, wherein the same portions as in FIG. 1 are shown by the same reference numerals except for a prime ('). In this structure, since the resistance in an area structuring a base $B'_2$ of the second stage transistor $T'_{r2}$ becomes larger because of an increased size of the second stage transistor $T'_{r2}$, that is, an increased area on a semiconductor chip as described in the foregoing, a resistor $R'_1$ is inserted between the emitter $E'_1$ of the first stage transistor $T'_{r1}$ and a base $B'_2$ of the second stage transistor $T'_{r2}$. In case where the value of the resistor $R'_1$ is large, the current amplification factor $h_{FE}$ is decreased. However, with the Darlington connection of two stages as shown in FIG. 2, the effect of reduction of the current amplification factor is relatively small, while a meritorious effect for miniaturization of the apparatus is greater.

FIG. 3 shows a circuit diagram of Darlington connections comprised of three transistors in a single device, which is referred to as a three-stage Darlington device hereinafter. In FIG. 3, $C'_1$, $E'_1$, $B'_1$ denote, respectively, a collector, an emitter, and a base in the first stage; $C'_2$, $E'_2$, $B'_2$ denote, respectively, a collector, an emitter and a base of the second stage; and $C'_3$, $E'_3$ and $B'_3$ denote, respectively, a collector, an emitter and a base in the third stage. A resistor $R'_1$ connected between the emitter $E'_1$ of the first stage transistor and the base $B'_2$ of the second stage transistor is a resistor of the three-stage Darlington device which has effect on the current amplification factor. Since a current flowing into the second stage transistor is larger than that in the first stage transistor and a current flowing into the third stage transistor is larger than that in the second stage transistor, areas occupied on the chip become larger sequentially, which is diagrammatically represented in FIG. 3. The basic purpose of the three-stage Darlington device is to make a current amplification factor larger and to structure the device in a single device for miniaturization of a module. In addition, in order to withstand an external voltage applied to the device, that is, in order to increase its breakdown voltage, it is necessary to use materials with high specific resistance. Accordingly, there is a relation of $R'_2 \gg R'_1$ in their resistance between the resistors $R'_1$ and $R'_2$ and thus the resistor $R'_2$ has greater effect on a current amplification factor than the case in FIG. 2, which causes many problems in practice.

More particularly, a specific structure of a conventional three-stage Darlington device will be described in the following. FIG. 4 is a plan view showing a specific structure of a conventional three-stage Darlington device, FIGS. 5 and 6 are cross-sectional views taken along the lines V—V and V1—V1, respectively, in FIG. 4, and FIG. 7 is a perspective view of the three-stage Darlington device.

Referring to these figures, a common collector layer 2 of $n^-$ type is deposited on a $n^+$ type of semiconductor substrate 1. Then, a plurality of, (in this example three), base regions 3, 4 and 5 of P type are formed in the common collector layer 2 by diffusion process. The three base regions 3, 4 and 5 constitute the base $B'_1$ of the first stage transistor, the base $B'_2$ of the second stage transistor and the base $B'_3$ of the third stage transistor, respectively. An n type region 6 constituting the emitter, $E'_1$ of the first stage transistor is formed in the base $B'_1$ region 3 and an n type region 7 constituting the emitter $E'_2$ of the second stage transistor is formed in the base $B'_2$ region 4. In addition, a plurality of, (in this example, 6), n type regions 8a, 8b–8f constituting the emitter $E'_3$ by connecting the regions 8a, 8b,–8f in parallel are formed in the base $B'_3$ region 5. Then, a metallization layer 9 is formed such that the three transistors are, in turn, connected in a Darlington configuration. To this end, an insulating layer 10 (FIGS. 5 and 6) is provided for insulating different portions of the metallization layer 9 from each other so that necessary Darlington connection is achieved. Bonding regions 11, 11 are formed on the metallization layer 9 on the emitter region 8a, 8b–8f for connecting the emitter $E'_3$ to an external circuit.

As shown in FIGS. 4 to 6, although a current entering from the emitter $E'_2$ of the second stage transistor into the base $B'_3$ of the third stage transistor flows separately into the metallization layer 9 of the surface and into the P type base diffussion layer 5, the resistance of the P type diffusion layer 5 has much effect on a current amplification factor since the metallization layer 9 is thin, and thus the current amplification factor decreases.

SUMMARY OF THE INVENTION

Briefly stated, the present invention is directed to a semiconductor device including a plurality of transistors connected in a Darlington configuration. The present semiconductor device comprises a semiconductor substrate; a common collector layer of a first conductivity type deposited on the semiconductor substrate; a plurality of base regions formed on the surface portion of the common collector layer, corresponding to said plurality of transistors, said plurality of base regions being independent from each other; a plurality of emitter regions of the first conductivity type each formed on the surface portion of each of the plurality of base regions, so that the plurality of transistors are structured; a metallization layer formed such that the plurality of transistors are in turn connected in a Darlington configuration; and a conductor wire connected between the metallization layer formed on a base region of the transistor of the last stage and the metallization layer formed on the emitter region of the transistor of the stage preceding the last stage.

In accordance with the present invention, a large current amplification factor can be achieved while maintaining a high breakdown voltage characteristic, since a conductor is connected between the base of the last stage transistor and the emitter of the transistor of the stage preceding the last stage so that the resistance therebetween is reduced.

In a preferred embodiment of the present invention, the conductor has a resistance smaller than that in the base region of the last stage transistor. Preferably, the conductor comprises an aluminum wire bonding.

Accordingly, a principal object of the present invention is to provide a semiconductor device including a plurality of transistors connected in a Darlington configuration which is capable of achieving a large current amplification factor while maintaining a high breakdown voltage characteristic.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
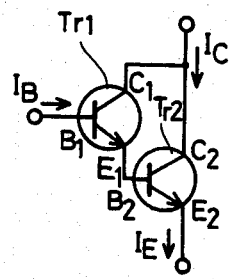
FIG. 1 is a Darlington circuit structured by two devices.
Figure 2:
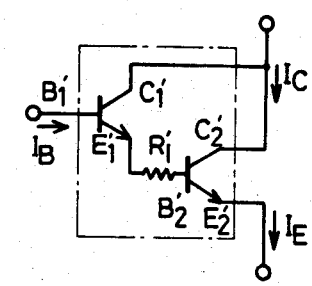
FIG. 2 is a Darlington circuit structured by a single device.
Figure 3:
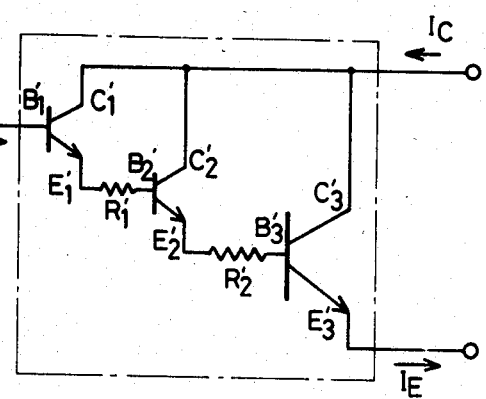
FIG. 3 is a three-stage Darlington circuit structured in a single device.
Figure 7:
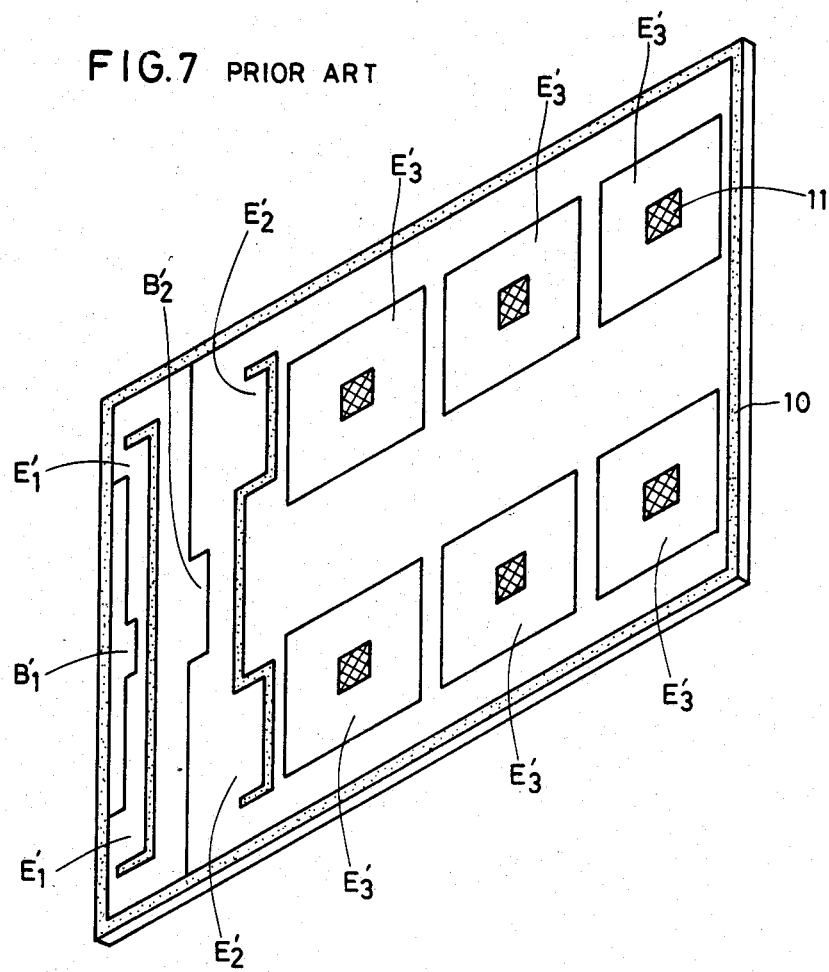
FIG. 7 is a circuit diagram showing a principle of the present invention.

FIG. 7 is a circuit diagram showing a principle of the present invention. FIG. 7 is the same as FIG. 3 except for a current path with low resistance $r'_2$ which is connected in parallel with the resistor $R'_2$. Since the current path $r'_2$ is connected in parallel with the resistor $R'_2$, effect on a current amplification factor by the resistor $R'_2$ is largely reduced and thus a three-stage Darlington device can be obtained with a large current amplification factor, while maintaining a high breakdown voltage characteristic.

Figure 4:
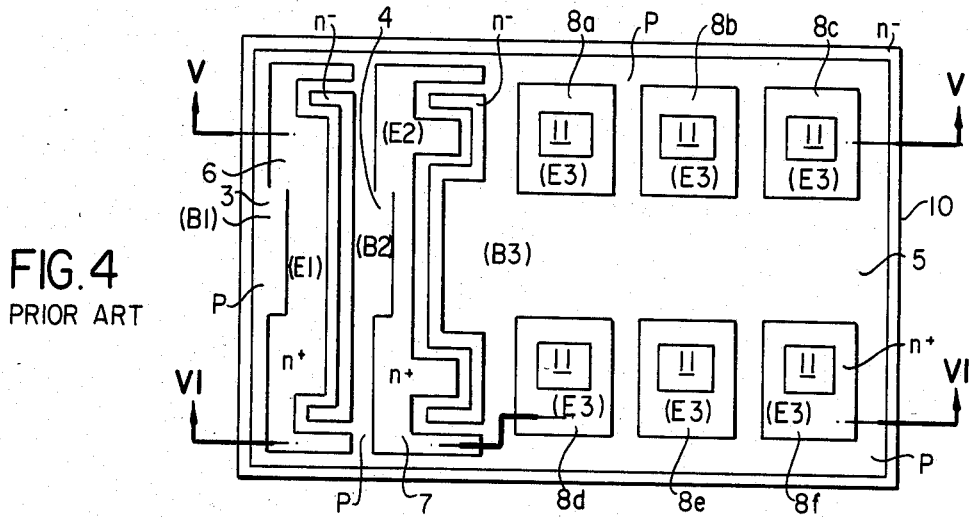
FIG. 4 is a plan view showing a specific structure of a conventional three-stage Darlington device.
Figure 5:
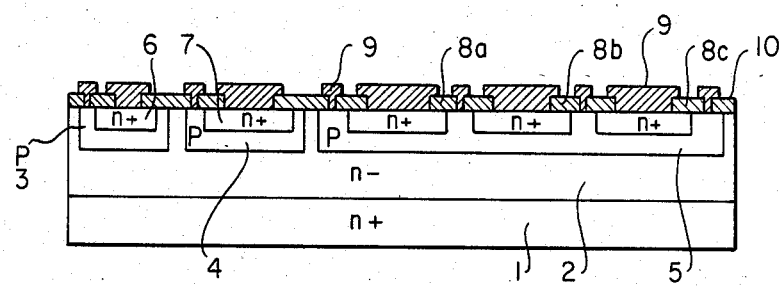
FIGS. 5 and 6 are cross-sectional views taken along the lines V—V and V1—V1, respectively of FIG. 4 or FIG. 7.
Figure 6:
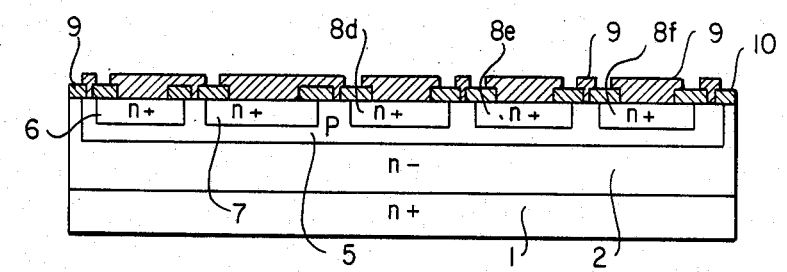
Figure 8:
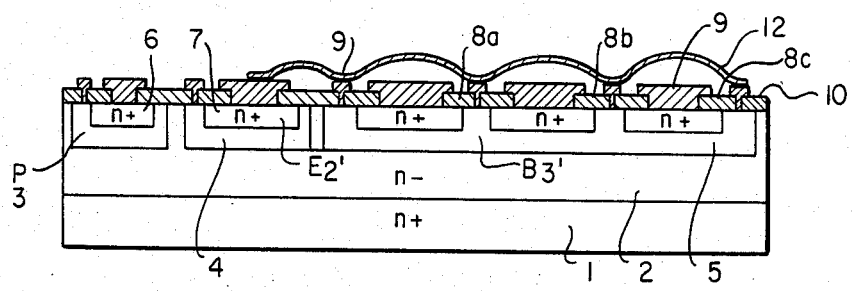
FIG. 8 is a plan view corresponding to FIG. 5 showing an embodiment of the present invention.

FIG. 8 is a sectional view corresponding to FIG. 5 showing an embodiment of the present invention. Except for aluminum wire 12, the semiconductor device itself as shown in FIG. 8 is exactly the same as that in FIGS. 5 to 7. In the present embodiment, as shown in FIG. 9, the surface of the emitter $E'_2$ region of the second stage transistor is bonded to the metallization layer 9 overlying the surface of the base region $B'_3$ of the third stage transistor by means of an aluminum wire 12, for example. The current path by the wire bonding corresponds to the current path $r'_2$ with low resistance in FIG. 7. Since the resistance of the aluminum wire 12 is small as compared with the resistor $R'_2$ formed by thin metallization layer 9 in parallel with its underlying base region, the aluminum wire 12 serves as a by-passing current path. Thus, a current amplification factor can be made large while maintaining a high breakdown voltage characteristic of the semiconductor device. This is because although the resistance of the base region $B'_3$ is much greater than that of metallization layer 9, the current amplification of the Darlington stages is very sensitive to any reduction of the composite resistance of the wire 12, layer 9 and base region $B'_3$. Accordingly, the reduction of the composite resistance by wire 12 significantly improves gain. According to an experiment, a current amplification factor more than twice the conventional device as shown in FIG. 4 was obtained.

Although, in the above described embodiment, a bonding is made by using an aluminum wire, the bonding is not intended to be limited to bonding aluminum. Any conductor having a lower resistance than the resistor $R'_2$ may be used, in which case the object of the present invention can be achieved.

As described in the foregoing, in accordance with the present invention, a large current amplification factor can be achieved while maintaining a high breakdown voltage characteristic of a semiconductor device, since a conductor is connected between the base of the last stage transistor and the emitter of the transistor preceding the last stage, so that the resistance therebetween is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a plurality of transistors connected in a Darlington configuration, comprising:

a semiconductor substrate, a common collector layer of a first conductivity type deposited on said semiconductor substrate, a plurality of base regions of a second conductivity formed on said common collector layer, corresponding to said plurality of transistors, said plurality of base regions being independent from each other, a plurality of emitter regions of the first conductivity type each formed on each of said plurality of base regions, so that said plurality of transistors are structured, a metallization layer interconnecting base and emitter regions of different ones of said plurality of transistors such that said plurality of transistors are in a Darlington configuration, and a conductor wire connected between a portion of the metallization layer formed on the base region of the transistor of the last stage and a portion of the metallization layer formed on the emitter region of the transistor of the stage preceding the last stage to electrically bypass resistance inherent in the metallization layer.

2. A semiconductor device in accordance with claim 1, wherein
said wire has a resistance smaller than that of the base region of the transistor of the last stage.

3. A semiconductor device in accordance with claim 1, wherein said wire is made of aluminum.

4. A semiconductor device in accordance with claim 1, wherein
said plurality of transistors comprise three transistors.

* * * * *